United States Patent [19]
Shinoto et al.

[11] Patent Number: 6,022,234
[45] Date of Patent: Feb. 8, 2000

[54] ELECTRONIC APPARATUS HAVING MECHANISM TO SECURE AN OPTIONAL BOARD

[75] Inventors: Koichi Shinoto; Takehiko Chiba, both of Kawasaki, Japan

[73] Assignee: Fujitsu Limited, Kawasaki, Japan

[21] Appl. No.: 08/937,186

[22] Filed: Sep. 29, 1997

[30] Foreign Application Priority Data

Oct. 1, 1996 [JP] Japan .................................. 8-260704

[51] Int. Cl.⁷ .................................................. H01R 13/62
[52] U.S. Cl. ........................................... 439/327; 361/801
[58] Field of Search .................................... 439/325, 327, 439/328; 361/796, 801, 802, 759

[56] References Cited

U.S. PATENT DOCUMENTS

| | | | |
|---|---|---|---|
| 4,964,810 | 10/1990 | Malotke et al. | 439/327 X |
| 5,245,169 | 9/1993 | Nakano | 439/326 X |
| 5,623,396 | 4/1997 | Blackwell | 439/327 X |

FOREIGN PATENT DOCUMENTS

| | | |
|---|---|---|
| 6-268386 | 9/1994 | Japan . |
| 7-106778 | 4/1995 | Japan . |
| 7-107421 | 4/1995 | Japan . |
| 7-147491 | 6/1995 | Japan . |
| 8-228083 | 9/1996 | Japan . |
| 8-250877 | 9/1996 | Japan . |

*Primary Examiner*—Khiem Nguyen
*Attorney, Agent, or Firm*—Armstrong, Westerman, Hattori, McLeland & Naughton

[57] ABSTRACT

An electronic apparatus carrying an option board 10 mounted on a main body of the apparatus by engaging a connector section 12 of the option board 10 with a connector 21 of the main body corresponding to the former, capable of securing the option board even though there is a difference in size between the option boards by pushing the option board toward the mother board in the main body of the apparatus. The electronic apparatus has a mechanism for securing the option board, in which an edge of the option board 10 opposite to the connector section 12 is positively pushed toward the connector 21 of the main body by a spring 31 or 42.

6 Claims, 6 Drawing Sheets

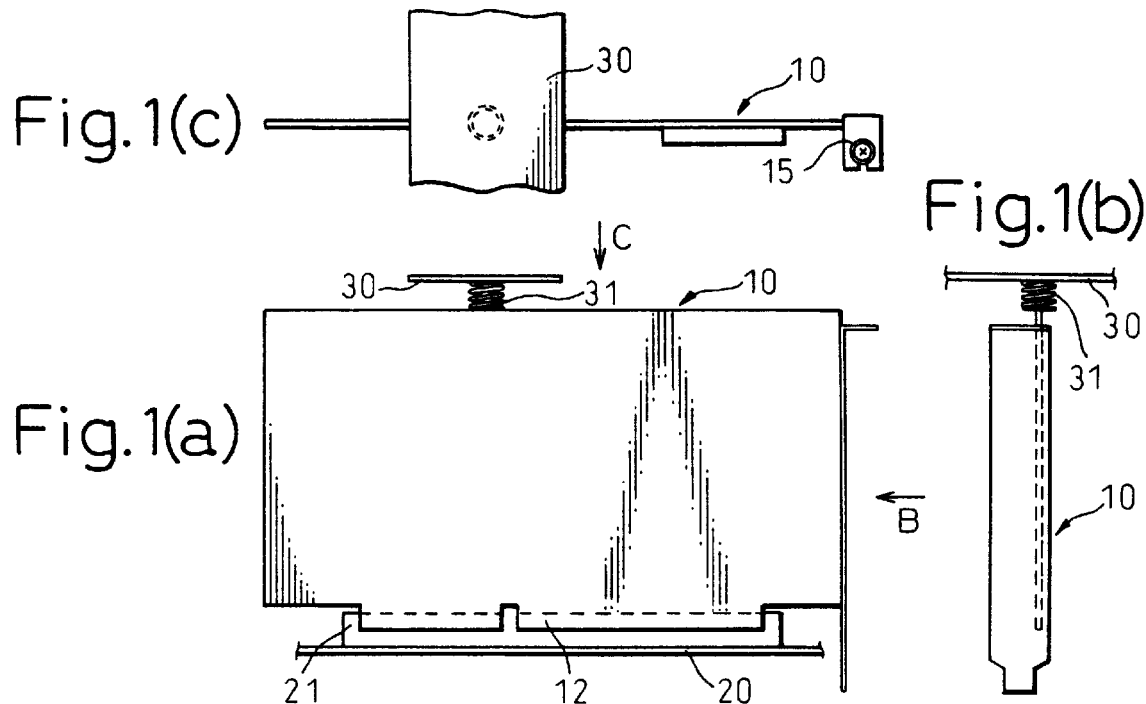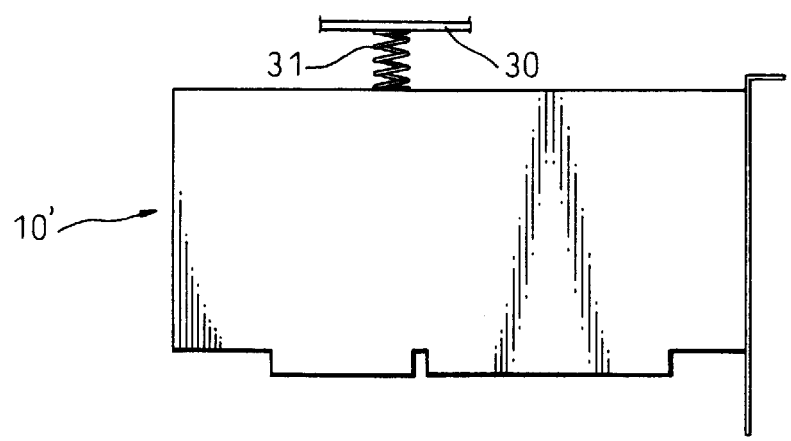

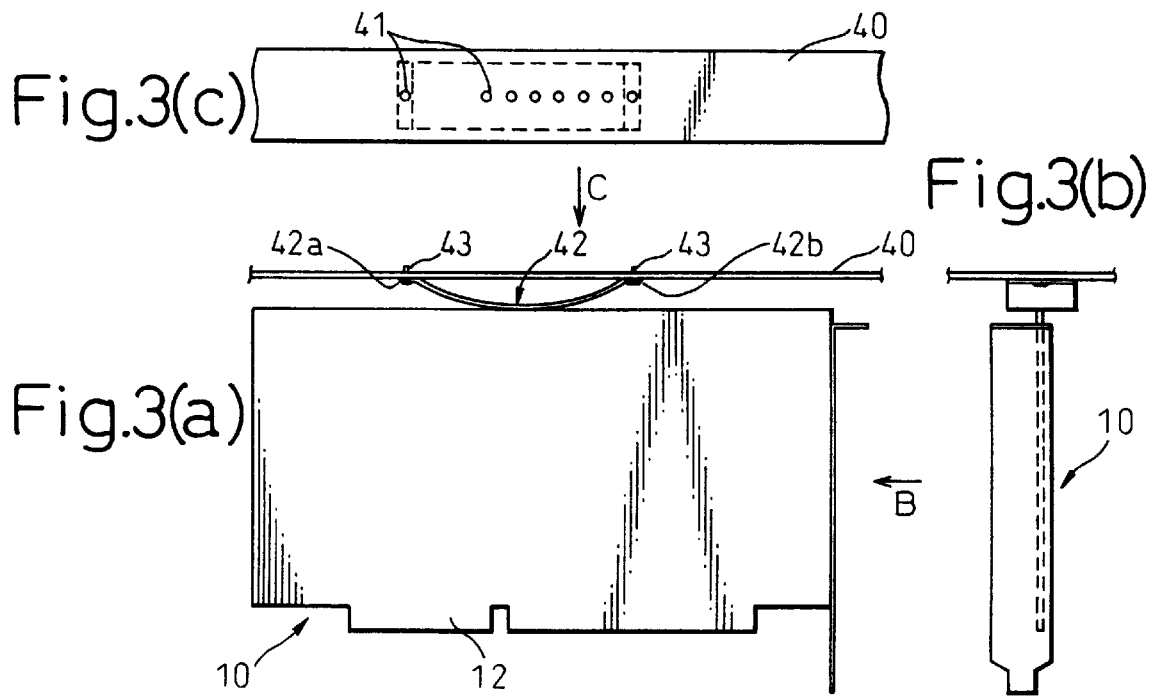
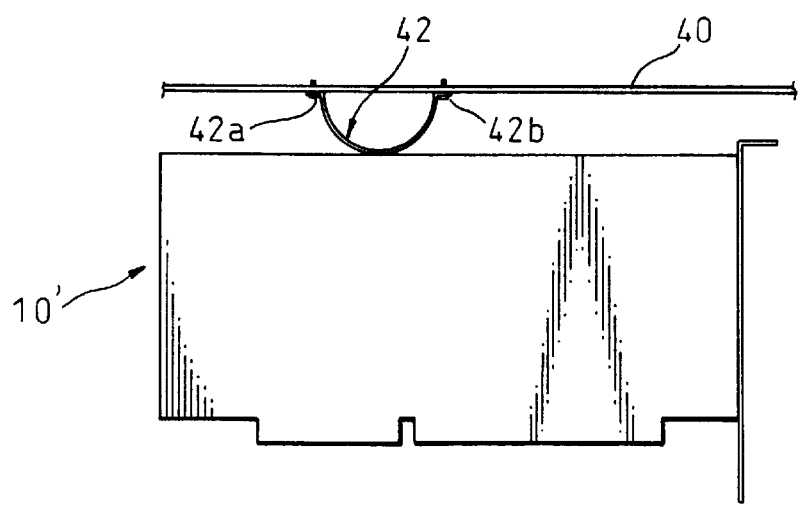

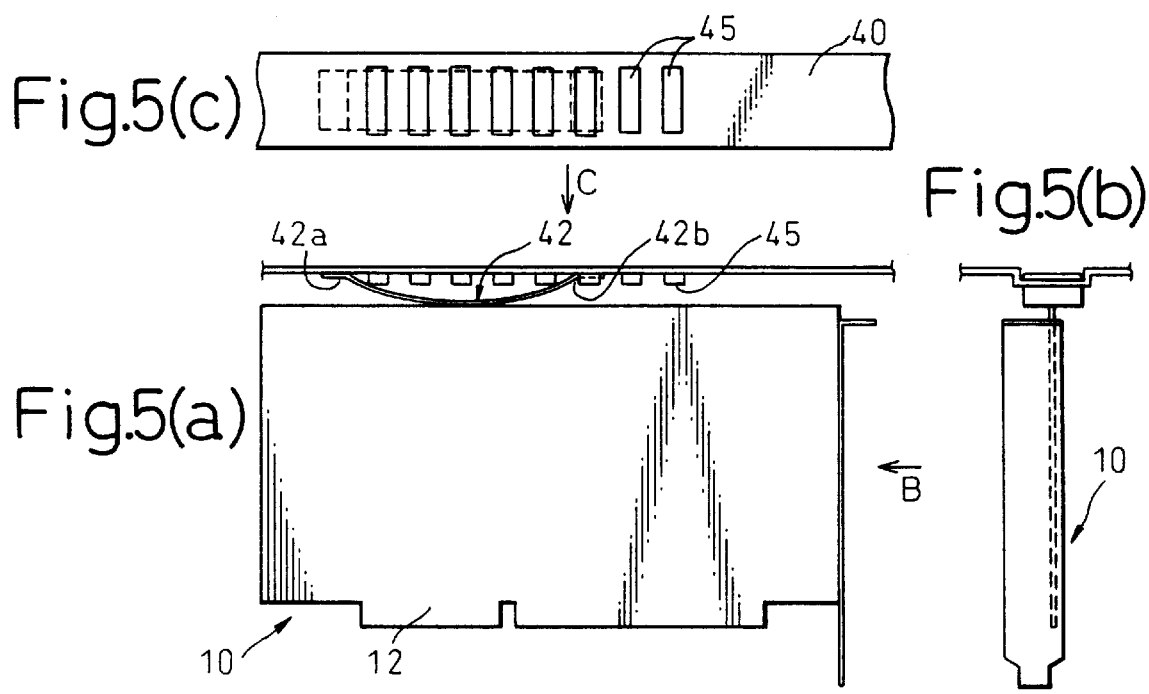
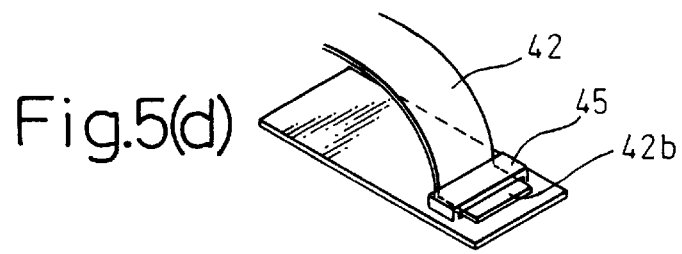
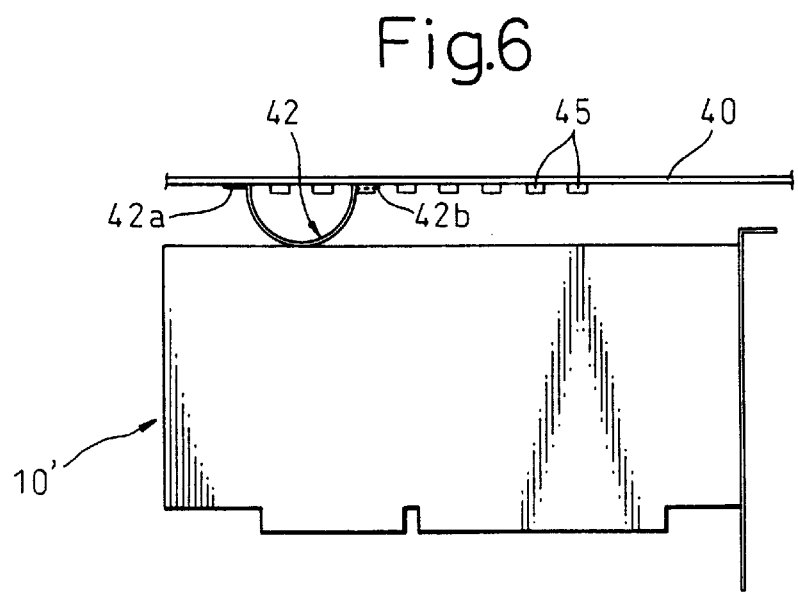

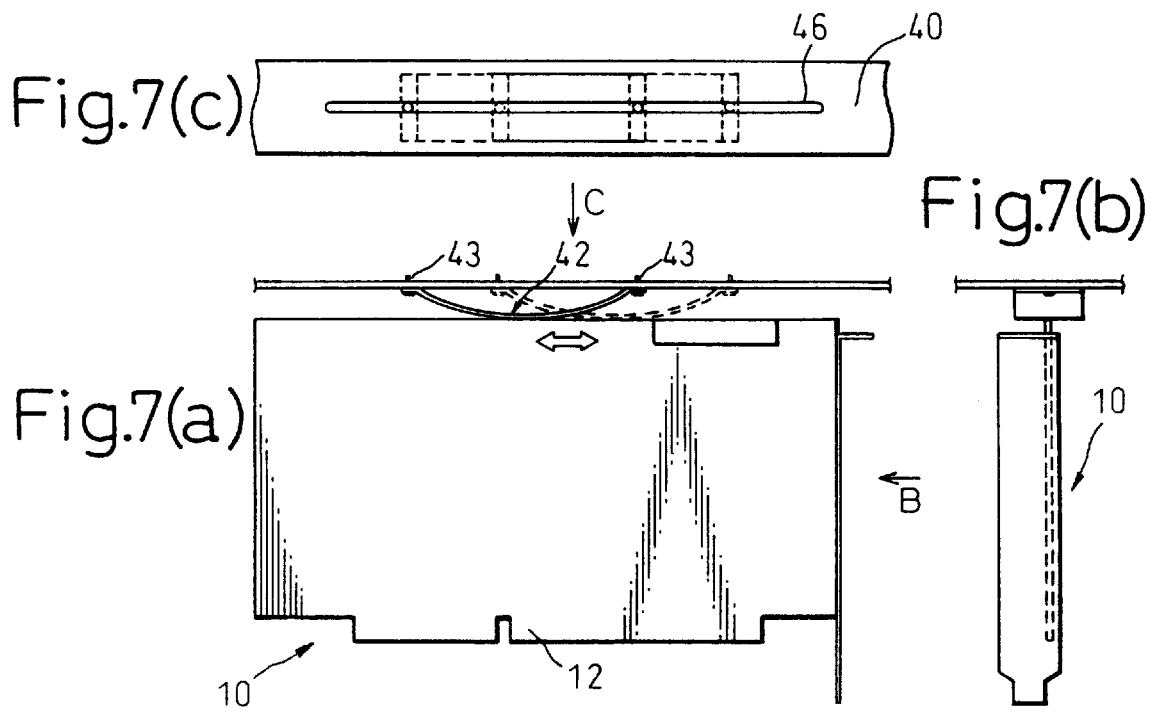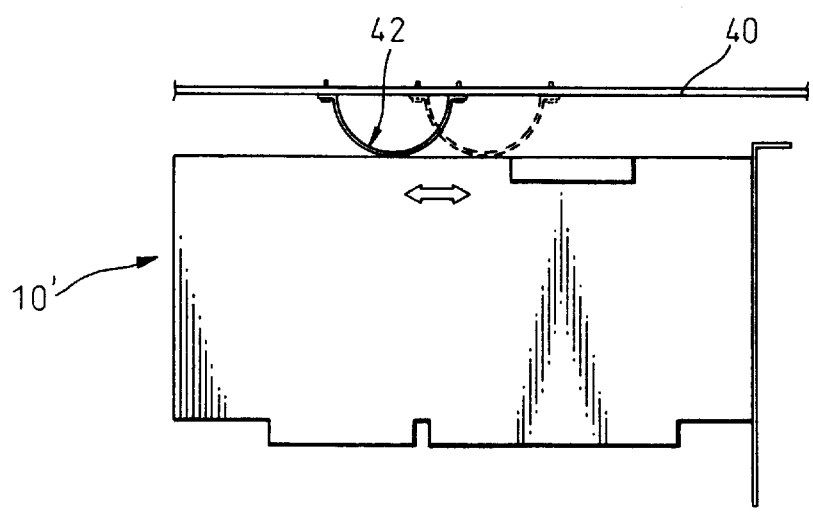

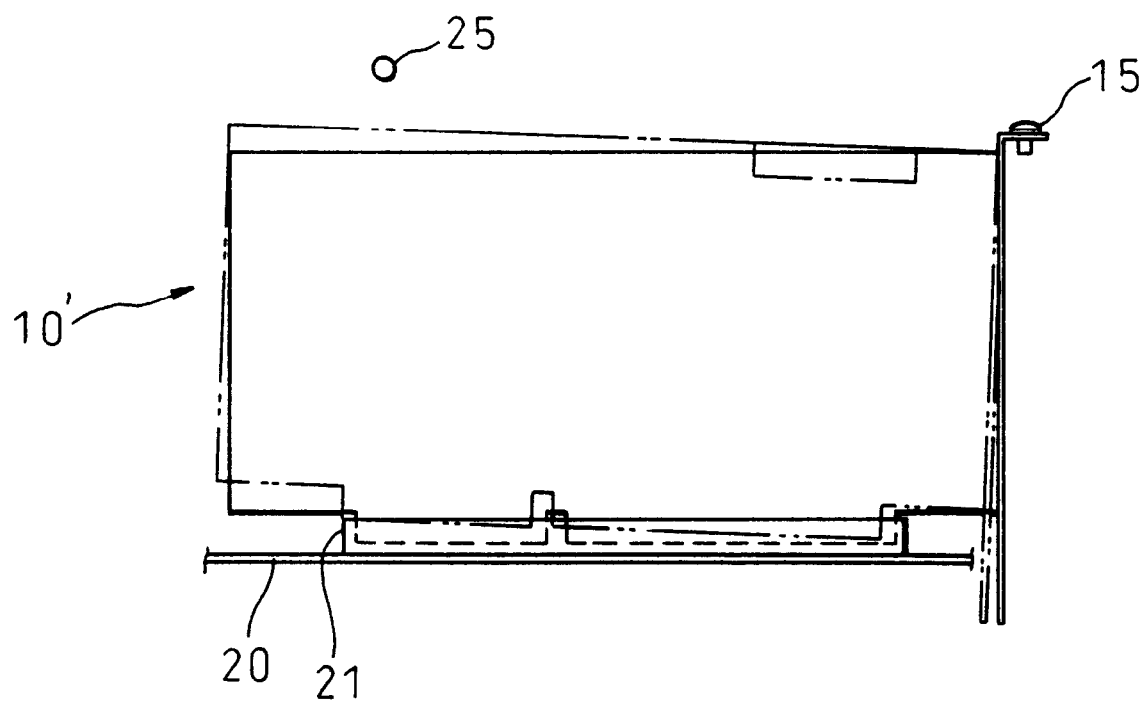

ELECTRONIC APPARATUS HAVING MECHANISM TO SECURE AN OPTIONAL BOARD

BACKGROUND OF THE INVENTION

1. Field of the Invention

The present invention relates to an electronic apparatus, such as a computer or a word processor, having a mechanism for securing an option board which is mounted to a main body of the apparatus, by preventing slip-off of the optional board, as necessary.

2. Description of the Related Art

Recently, there have been many electronic apparatuses such as a personal computer or a word processor provided with various optional devices separately from a standard equipment, in response to the user's demand. Such optional devices may be individually mounted on the apparatus by a user in a place of use or by a distributor in response to the demand of the respective user, or may be preliminarily mounted on the apparatus in a factory and sold as is. The latter case has become a recent trend.

Particularly, when an option board is preliminarily mounted to the main body, it is necessary to secure the option board to a connector of the main body because vibration and/or shock generated during the transportation or distribution of the electronic apparatus may dislodge an unsecured board.

FIGS. 9 and 10 illustrate one of the examples of the conventional by known mechanism for securing an option board; wherein FIG. 9(a) is a perspective view of an option board mounted on a main body of an electronic apparatus; FIG. 9(b) is a side view thereof; FIG. 9(c) is a front view thereof; FIG. 9(d) is a plan view thereof; and FIG. 10 is a side view illustrating a state in which an option board slips off from a connector of the main body due to the difference in size of the option board.

An option board 10 has circuit patterns and conductive through-holes, not illustrated on a surface 11 thereof, and carries electronic elements such as a CPU (central processing unit) thereon. The option board 10 also has a connector section 12 on the lower edge and a front plate 13 on the front side. A slot 14 is provided on a top of the front plate 13 for fixing the option board.

Such an option board 10 is mounted on a main body of an electronic apparatus if necessary. When mounted, the connector section 12 on the lower edge of the option board is engaged with a connector 21 carried on a mother board 20 of the main body. After the connectors 12 and 21 have been engaged with each other, a screw 15 is inserted into the slot 14 to fix the option board to a frame (not shown) of the main body.

To further prevent the connector section 12 of the option board 10 from slipping off from the connector 21 of the mother board 20, a stop rod 25 extending transversely to the option board 10 is provided at a position above a rear half of the upper edge of the option board 10 (farther from the front plate 13). The stop rod 25 operates to block the way of the option board 10 being slipping off.

However, the size of the option board may vary in accordance with various requirements of the user which may cause a gap between the stop rod 25 and the option board 10 or 10' as shown in FIG. 9 or 10 and results in the slip-off of the connector section 12 of the option board 10 or 10' from the connector 21 of the mother board 20 due to vibration and/or shock applied thereto in the distribution route.

SUMMARY OF THE INVENTION

Accordingly, an object of the present invention is to provide an electronic apparatus having a mechanism to secure an option board by preventing the slip-off of the same from a mother board, by positively pressing the option board onto the mother board in a main body of the apparatus.

To achieve the above object, according to the present invention, an electronic apparatus carrying an option board mounted to a main body of the apparatus by engaging a connector section of the option board with a connector of the main body corresponding to the former is provided, wherein the apparatus comprises a mechanism for preventing the slip-off of the option board wherein an edge of the option board away from the connecting section thereof is pressed onto the connector of the main body by a spring. Since the option board is always pressed by the spring toward the main body, it is possible to prevent the option board from slipping off from the main body due to vibration and/or shock even if the sizes of the option boards vary.

The spring may be a coil spring disposed between the main body and the upper edge of the option board. Since a sufficient distance is covered by the elastic strain of the spring in the operative direction of the spring, it is possible to use the same spring for option boards of different sizes.

The spring may be a blade spring disposed between the main body and the upper edge of the option board. This blade spring is position-adjustable in accordance with size-variation of the option boards. The blade spring is fixed at one end to the main body and at the other end to a selected one of a plurality apertures formed in the main body by a screw, so that the upper edge of the option board is pressed by a middle portion of the blade spring. By selecting a suitable aperture for fixing the other end of the blade spring, it is possible to obtain an optimal pressure in accordance with sizes of the option boards and stably prevent the slip-off of the option board.

Alternatively, the blade spring may be fixed at one end to the main body and inserted at the other end into a selected one of a plurality of hook-shaped slits provided in the main body, so that the upper edge of the option board is pressed by a middle portion of the blade spring. By inserting the other end of the blade spring into a suitable hook-shaped slit, it is possible to readily obtain an optimal pressure in accordance with the sizes of the option boards.

Otherwise, an elongate groove may be provided in the main body, within which opposite ends of the blade spring are fixed by screws at optional positions, so that the upper edge of the option board is pressed by a middle portion of the blade spring. By selecting suitable positions within the elongate groove at which the opposite ends of the blade spring are fixed in accordance with sizes and/or shapes of the option boards, it is possible to treat various option boards having different sizes and/or shapes.

In such a manner, the blade spring is position-adjustable in accordance with sizes and/or shapes of the option board, whereby it is possible to always apply a proper pressure onto the option board.

Also, a mechanism for preventing the slip-off of an option board is provided, which is used for an electronic apparatus carrying the option board mounted to a main body of the apparatus by engaging a connector section of the option board with a connector of the main body corresponding to the former, wherein an edge of the option board farther from the connecting section thereof is pressed onto the connector of the main body by a spring. According to this mechanism, it is possible to prevent the slip-off of the option board due to vibration and/or shock even though a size of the option board varies.

BRIEF DESCRIPTION OF THE DRAWINGS

FIGS. 1(a) to 1(c) illustrate a first embodiment of a mechanism to secure an option board by preventing the slip-off of the same according to the present invention; in which FIG. 1(a) is a side view thereof, FIG. 1(b) is a front view thereof, and FIG. 1(c) is a plan view thereof;

FIG. 2 is a side view of the first embodiment in which the option board is different in size;

FIGS. 3(a) to 3(c) illustrate a second embodiment of a mechanism for preventing the slip-off of an option board according to the present invention; in which FIG. 3(a) is a side view thereof, FIG. 3(b) is a front view thereof, and FIG. 3(c) is a plan view thereof;

FIG. 4 is a side view of the second embodiment in which the option board is different in size;

FIGS. 5(a) to 5(d) illustrate a third embodiment of a mechanism for preventing the slip-off of an option board according to the present invention; in which FIG. 5(a) is a side view thereof, FIG. 5(b) is a front view thereof, FIG. 5(c) is a plan view thereof, and FIG. 5(d) is a perspective view of a blade spring;

FIG. 6 is a side view of the third embodiment wherein the option board is different in size;

FIGS. 7(a) to 7(c) illustrate a fourth embodiment of a mechanism for preventing the slip-off of an option board according to the present invention; in which FIG. 7(a) is a side view thereof, FIG. 7(b) is a front view thereof, FIG. 7(b) is a front view thereof, and FIG. 7(c) is a plan view thereof;

FIG. 8 is a side view of the fourth embodiment wherein the option board is different in size;

FIGS. 9(a) to 9(d) illustrate one example of a conventional mechanism for preventing the slip-off of an option board; in which FIG. 9(a) is a perspective view thereof, FIG. 9(b) is a side view thereof, FIG. 9(c) is a front view thereof, and FIG. 9(d) is a plan view thereof; and FIG. 10 is a side view illustrating a state in which an option board slips off from a connector of a main body of an electronic apparatus due to the difference in size of the option board.

DETAILED DESCRIPTION OF THE EMBODIMENTS

Figure 9A:
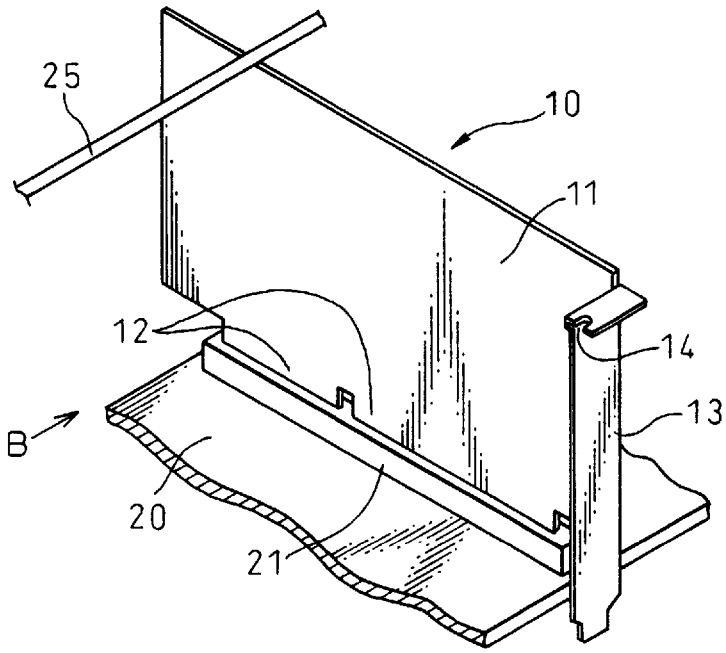

The present invention will be described below in more detail with reference to the preferred embodiments illustrated in FIGS. 1 to 8.

FIGS. 1(a) to 1(c) illustrate a first embodiment of a mechanism to secure an option board by preventing the slip-off of the same according to the present invention; in which FIG. 1(a) is a side view thereof, FIG. 1(b) is a front view thereof, and FIG. 1(c) is a plan view thereof. FIG. 2 is a side view of the first embodiment in which the option board is different in size.

According to the first embodiment, a coil spring 31 is provided in a frame 30 of a main body of an electronic apparatus at a position above a rear half of the upper edge of an option board 10 (farther from a front plate 13), for restricting circuit boards, and pushes the upper edge of the option board 10 downward so that a connector section 12 of the option board 10 is prevented from slipping off from a connector 21 of a mother board 20 in the main body.

Since the coil spring is capable of largely elastically deforming in the operative direction, even if another option board 10' having a smaller height than the former 10 is used, as shown in FIG. 2, the option board 10' is always pushed down by the coil spring 31 to stop the connector section 12 from slipping off from the connector of the mother board 20.

In this regard, a slot 14 is provided on a top of the front plate 13 of the option board 10, 10', for inserting a screw 15 for fixing the option board 10, 10' in the same manner as in the prior art. That is, after the connectors 12, 21 are engaged with each other, the screw 15 is inserted into the slot 14 and fastened to a frame of the main body (not shown).

FIGS. 3(a) to 3(c) illustrate a second embodiment of a mechanism to secure an option board by preventing the slip-off of the same according to the present invention; in which FIG. 3(a) is a side view thereof, FIG. 3(b) is a front view thereof, and FIG. 3(c) is a plan view thereof. FIG. 4 is a side view of the second embodiment in which the option board is different in size.

According to the second embodiment, a row of apertures 41 are provided on a frame 40 of the main body for restricting circuit boards in parallel to the upper edge of the option board 10. A blade or leaf spring 42 is fastened to the apertures 41 by screws 43.

Specifically, in this embodiment, one end 42a of the blade spring 42 is fixed to the aperture at a predetermined position and the other end 42b thereof is fixed to a suitable one of the apertures selected in accordance with a size of the option board 10 so that the upper edge of the option board 10 is pushed down by a middle portion of the blade spring. Thus, for the option board 10 shown in FIG. 3 and that 10' shown in FIG. 4, each having a different height from the other, the other end 42b of the blade spring 42 is fixed to each the aperture 41 formed at a position different from the other.

According to this embodiment, it is possible to push the option board 10, 10' downward at a constant pressure even though the height thereof varies and to reliably prevent the slip-off of the option board form occurring.

FIGS. 5(a) to 5(d) illustrate a third embodiment of a mechanism for preventing the slip-off of an option board according to the present invention; in which FIG. 5(a) is a side view thereof, FIG. 5(b) is a front view thereof, FIG. 3(c) is a plan view thereof, and FIG. 5(d) is a perspective view of a blade spring. FIG. 6 is a side view of the third embodiment in which the option board is different in size.

According to the third embodiment, a blade spring 42 is used as in the second embodiment. However, the blade spring 42 is not fixed by screws but fitted to hook-shaped slits. Specifically, a row of hook-shaped slits 45 are provided on a frame 40 of the main body for restricting circuit boards in parallel to the upper edge of the option board 10. The hook-shaped slit 45 is made by applying sheet-metal working to a plate forming the frame 40 so that a structure shown in FIG. 5(d) is obtained. While only one hook-shaped slit 45 is shown in FIG. 5(d), a plurality thereof are arranged in practice.

The blade spring 42 is of a curved configuration except for opposite ends 42a, 42b thereof which are flat, wherein the end 42a is fixed to the frame 40 by a welding or others and the other end 42b is inserted into a suitable one of the hook-shaped slits 45 selected in accordance with a size of the option board 10 so that the option board 10 is pushed down at a predetermined pressure.

Thus, according to this embodiment, for the option board 10 shown in FIG. 5 and that 10' shown in FIG. 6 different in height from each other, it is possible to push each of them downward at a constant pressure of the spring by fixing the other end 42b of the blade spring 42 in each the hook-shaped slit 45 formed at a position different from the other, and to reliably prevent the slip-off of the option board from occurring.

FIGS. 7(a) to 7(c) illustrate a fourth embodiment of a mechanism for preventing the slip-off of an option board according to the present invention; in which FIG. 7(a) is a side view thereof, FIG. 7(b) is a front view thereof, and FIG. 7(c) is a plan view thereof. FIG. 8 is a side view of the fourth embodiment in which the option board is different in size.

According to this embodiment, a relatively elongate groove 46 is provided on a frame 40 of the main body for restricting circuit boards in parallel to the upper edge of the option board 10, and a blade spring 42 is fastened to the elongate groove 46 by screws 43 or the like.

One end 42a of the blade spring 42 is fixed to a predetermined position within the elongate groove 46, and the other end 42b thereof is fixed to a suitable position thereof selected in accordance with a size of the option board 10. Thus, for the option board 10 shown in FIG. 7 and that 10' shown in FIG. 8 different in height from each other, it is possible to push each of them downward at a constant pressure of the spring and to reliably prevent the slip off of the option board from occurring.

Figure 9D:
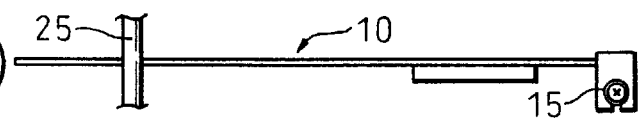
Figure 9C:
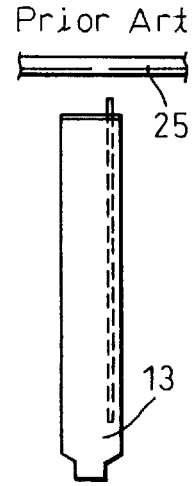
Figure 9B:
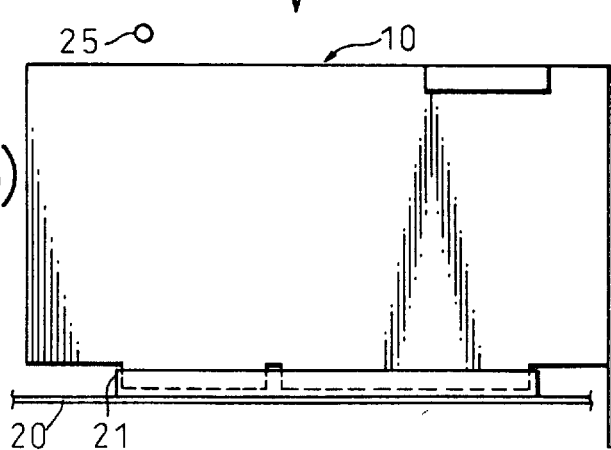

Also, a position to which the spring pressure is applied onto the upper edge of the option board 10 or 10' may be optionally changed as shown by a dotted line in the arrowed direction in FIGS. 7 and 8. In such a manner, the option board 10 may be pushed downward at a center of the upper edge thereof if the front plate 13 of the option board 10 is not fastened to the main body of the apparatus by the screw 15 (FIG. 9); while, it may be pushed downward at another position above a portion thereof wherein the slip-off of the connector section 12 of the option board 10 is liable to occur, if necessary.

As described above, according to the present invention, since the option board is pushed toward the mother board while taking a size of the option board into account, it is possible to reliably prevent the slip-off of the option board from occurring, and thus to eliminate a risk of wear of contacts due to vibration and/or shock generated during the transportation, resulting in the improvement in overall reliability of electronic apparatus.

The present invention has been described in detail with reference to the preferred embodiments illustrated in the attached drawings, but should not be understood to be limited thereto. It should be noted that the present invention includes various modifications and changes derived from the above embodiments without departing from the spirit and scope of the present invention.

We claim:

1. An electronic apparatus carrying an option board mounted on a main body of the apparatus by engaging a connector section of the option board with a connector of the main body corresponding to the former, wherein the apparatus comprises a mechanism for securing the option board in which an edge of the option board away from the connecting section thereof is pressed onto the connector of the main body via a spring, wherein the spring is a blade spring disposed between the main body and the upper edge of the option board, and wherein the blade spring is fixed at one end to the main body and at the other end to a selected one of a plurality apertures formed in the main body by screws, so that the upper edge of the option board is pressed by a middle portion of the blade spring.

2. An electronic apparatus carrying an option board mounted on a main body of the apparatus by engaging a connector section of the option board with a connector of the main body corresponding to the former, wherein the apparatus comprises a mechanism for securing the option board in which an edge of the option board away from the connecting section thereof is pressed onto the connector of the main body via a spring, wherein the spring is a blade spring disposed between the main body and the upper edge of the option board, and wherein the blade spring is fixed at one end to the main body and inserted at the other end into a selected one of a plurality of hook-shaped slits provided in the main body, so that the upper edge of the option board is pressed by a middle portion of the blade spring.

3. An electronic apparatus carrying an option board mounted on a main body of the apparatus by engaging a connector section of the option board with a connector of the main body corresponding to the former, wherein the apparatus comprises a mechanism for securing the option board in which an edge of the option board away from the connecting section thereof is pressed onto the connector of the main body via a spring, wherein the spring is a blade spring disposed between the main body and the upper edge of the option board, and wherein an elongate groove is provided in the main body, within which opposite ends of the blade spring are fixed by screws at optional positions, so that the upper edge of the option board is pressed by a middle portion of the blade spring.

4. A mechanism for securing an option board, used for an electronic apparatus carrying the option board mounted on a main body of the apparatus by engaging a connector section of the option board with a connector of the main body corresponding to the former, wherein an edge of the option board away from the connecting section thereof is pressed onto the connector of the main body via a spring, wherein the spring is a blade spring disposed between the main body and the upper edge of the option board, and wherein the blade spring is fixed at one end to the main body and at the other end to a selected one of a plurality apertures formed in the main body by screws, so that the upper edge of the option board is pressed by a middle portion of the blade spring.

5. A mechanism for securing an option board, used for an electronic apparatus carrying the option board mounted on a main body of the apparatus by engaging a connector section of the option board with a connector of the main body corresponding to the former, wherein an edge of the option board away from the connecting section thereof is pressed onto the connector of the main body via a spring, wherein the spring is a blade spring disposed between the main body and the upper edge of the option board, and wherein the blade spring is fixed at one end to the main body and inserted at the other end into a selected one of a plurality of hook-shaped slits provided in the main body, so that the upper edge of the option board is pressed by a middle portion of the blade spring.

6. A mechanism for securing an option board, used for an electronic apparatus carrying the option board mounted on a main body of the apparatus by engaging a connector section of the option board with a connector of the main body corresponding to the former, wherein an edge of the option board away from the connecting section thereof is pressed onto the connector of the main body via a spring, wherein the spring is a blade spring disposed between the main body and the upper edge of the option board, and wherein an elongate groove is provided in the main body, within which opposite ends of the blade spring are fixed by screws at optional positions, so that the upper edge of the option board is pressed by a middle portion of the blade spring.

* * * * *